United States Patent
Kattan

(10) Patent No.: US 6,822,485 B2
(45) Date of Patent: Nov. 23, 2004

(54) METHOD FOR CALIBRATING THRESHOLD LEVELS ON COMPARATORS WITH DITHERED DC SIGNALS

(75) Inventor: Shalom Kattan, Campbell, CA (US)

(73) Assignee: Guide Technology, Sunnyvale, CA (US)

( * ) Notice: Subject to any disclaimer, the term of this patent is extended or adjusted under 35 U.S.C. 154(b) by 53 days.

(21) Appl. No.: 10/218,984

(22) Filed: Aug. 14, 2002

(65) Prior Publication Data

US 2004/0032353 A1 Feb. 19, 2004

(51) Int. Cl.$^7$ ............................. H03K 3/02; H03M 1/10
(52) U.S. Cl. ............................ 327/78; 341/120; 341/131
(58) Field of Search ..................... 327/77, 78; 341/120, 341/131

(56) References Cited

U.S. PATENT DOCUMENTS

| | | | |
|---|---|---|---|
| 4,757,452 A | | 7/1988 | Scott et al. |
| 5,666,075 A | * | 9/1997 | Schinzel ...................... 327/77 |
| 5,936,435 A | * | 8/1999 | Schwenkel et al. ........... 327/78 |
| 6,091,671 A | | 7/2000 | Kattan |
| 6,181,649 B1 | | 1/2001 | Kattan |
| 6,185,509 B1 | | 2/2001 | Wilstrup et al. |
| 6,194,925 B1 | | 2/2001 | Kimsal et al. |
| 6,226,231 B1 | | 5/2001 | Kattan |
| 6,298,315 B1 | | 10/2001 | Li et al. |
| 6,356,850 B1 | | 3/2002 | Wilstrup et al. |
| 6,384,496 B1 | | 5/2002 | Pyntikov et al. |
| 6,393,088 B1 | | 5/2002 | Emineth et al. |

FOREIGN PATENT DOCUMENTS

| | | | | |
|---|---|---|---|---|
| EP | 219701 A2 | * | 4/1987 | ............ H03K/5/08 |
| JP | 60259018 A | * | 12/1985 | ........... H03K/17/30 |

OTHER PUBLICATIONS

U.S. patent application Publication No. US 2001/0028262 A1, Publication Date Oct. 11, 2001, Kimsal, et al.
U.S. patent application Publication No. US2001/0044704A1, Publication Date Nov. 22, 2001, Li, et al.

* cited by examiner

Primary Examiner—Howard L. Williams
(74) Attorney, Agent, or Firm—Dority & Manning, P.A.

(57) ABSTRACT

An improved method for calibrating threshold voltage levels on comparators corresponds to providing a dithered DC signal to one input and adjusting the threshold voltage on the other input in response to the comparator output. Such calibration may be necessary for comparator circuitry associated with measurement devices. A circuit to generate a dithered DC signal sums a precise DC value with a time-varying signal that has been modified, such as a rectified AC signal. During the calibration procedure, the internal threshold voltage is varied until no timing measurements are present. The difference between the determined optimum threshold voltage and the ideal voltage is stored in a system computer associated with the measurement device and used later in the measurement process to produce a precise threshold voltage input.

21 Claims, 5 Drawing Sheets

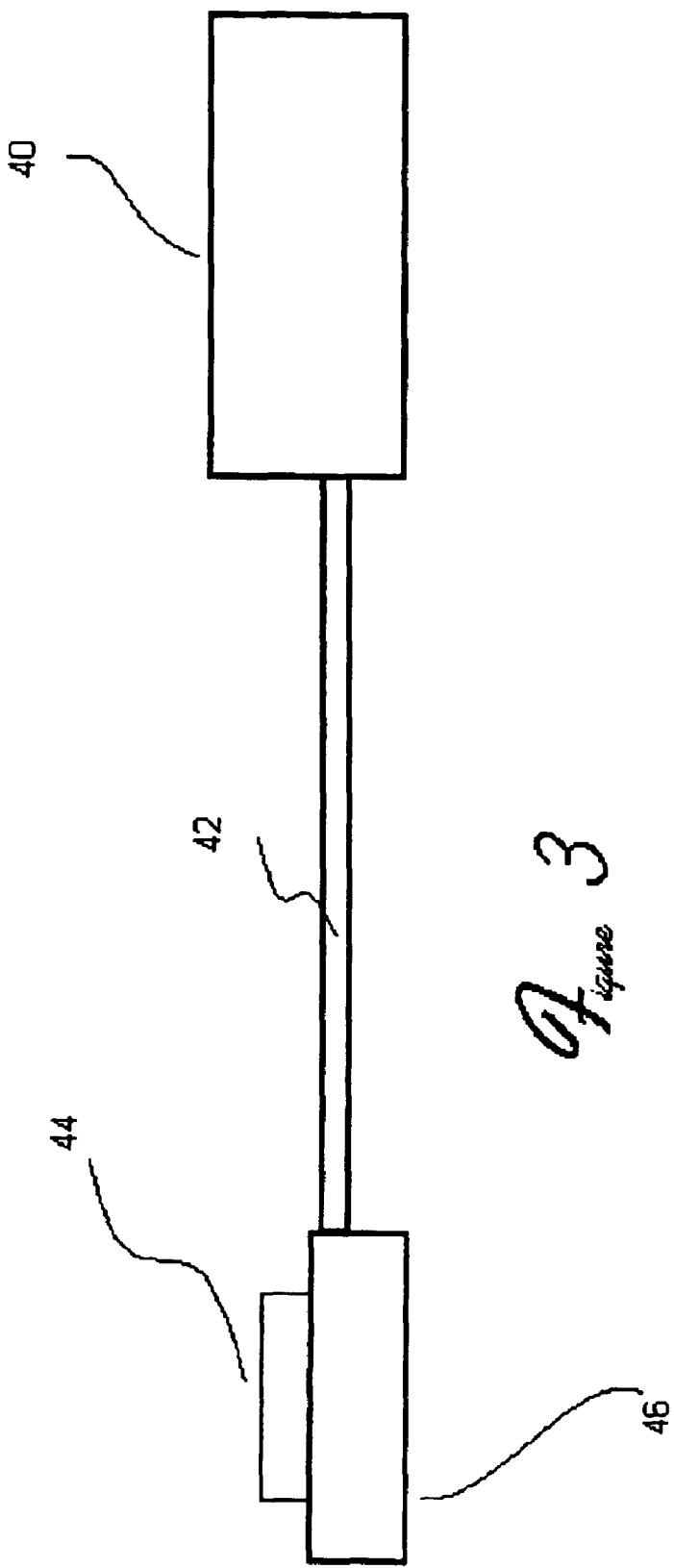

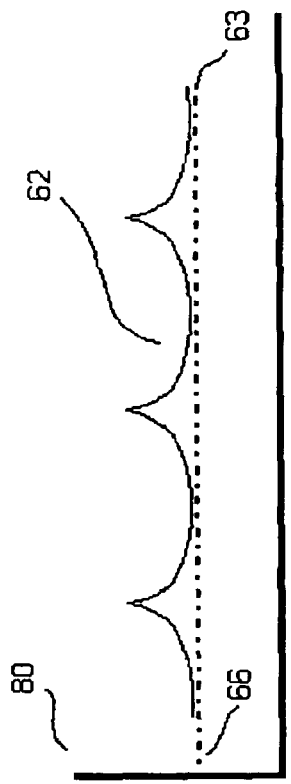
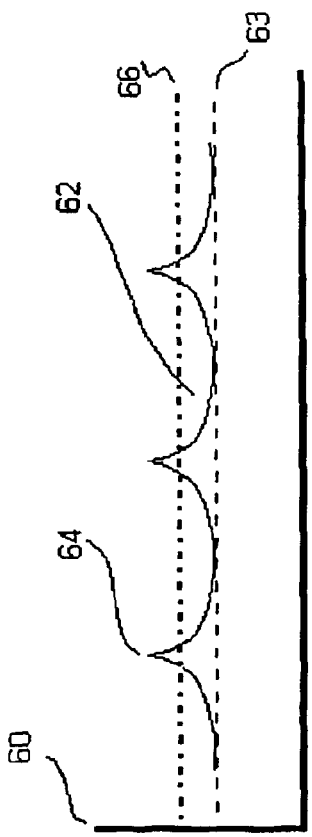
Figure 4(a)
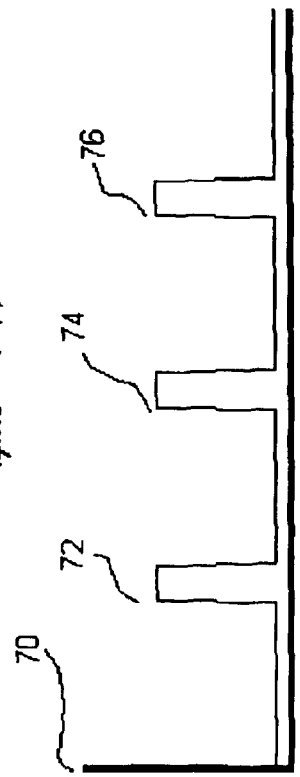
Figure 4(b)

METHOD FOR CALIBRATING THRESHOLD LEVELS ON COMPARATORS WITH DITHERED DC SIGNALS

BACKGROUND OF THE INVENTION

The field of integrated circuits and electronic devices is ever-expanding. As the field expands, the integrated circuits and electronic devices themselves become smaller and faster. The decreasing size and increasing speed provides a challenge to equipment designers and manufacturers in that a large number of signals which occur at very high frequencies must be precisely coordinated. In order to ensure reliable operation, functionality and timing tests must be performed on integrated circuits and electronic devices.

To that end, a wide variety of tools and techniques have been developed in the field of testing. One such technique, referred to as direct time measurement, utilizes a time measurement device to detect certain signal events occurring within a measured signal. A signal event, as referenced herein, is intended to represent the point in a signal at which the signal voltage transitions above or below a given threshold voltage. These time measurement devices typically feature a number of measurement channels, each of which contains at least one measurement circuit. An example of such a device can be found in U.S. Pat. No. 6,091,671, issued to Kattan, for a time interval analyzer, which is incorporated by reference for all purposes herein. Another example of a time measurement device is found in U.S. Pat. No. 6,194,925, issued to Kimsal et al. and herein fully incorporated for all purposes by reference. The '925 patent discloses a time interval measurement system in which a voltage differential across a hold capacitor generated between events occurring in an input signal determines the time interval between events. The measurement system of the '925 patent utilizes a linear ramp generating circuit to ensure a linear discharge of the capacitor for easier measurement of the occurrence of the events.

Still another suitable time measurement device that may be used with aspects of the present technology is found in U.S. Pat. No. 4,757,452, issued to Scott, et al., and herein fully incorporated for all purposes by reference. The '452 patent provides a system for measuring timing jitter of a tributary data stream that has been multiplexed into a higher-rate multiplex stream using pulse stuffing techniques. The '452 patent is an event-counter-based system that does not directly measure time intervals but determines their frequency by maintaining a continuous count of the number of pulses occurring within a signal.

A wide variety of measurement circuits are available, many of which detect an event using a comparator. A signal event is typically detected by comparing the voltage of the measurement signal with a direct current (DC) threshold voltage, thereby converting the measured signal into a more readily processed timing signal. A comparator, as is known in the art, compares one voltage to another, and produces a signal indicating which voltage is greater or lesser (depending upon the configuration). In a typical comparator, one voltage is designated the reference (or threshold) voltage. When the other voltage input exceeds the threshold voltage, the output shifts from low to high (or high to low, again depending upon configuration). Thus, a measurement circuit comparator typically receives a signal to be measured and converts it to a binary timing signal. This timing signal may then be routed to other components in a measurement circuit, where it is more readily processed for obtaining certain timing information.

While precision components are preferably used in the construction of the internal circuitry measurement circuits, there is a certain margin of error that is unavoidable. This may be due to unmatched components, ambient noise, temperature effects, or irregularities in fabrication. Such a margin exists in the threshold voltage-generating circuitry, and consequently there is a need to ensure that this voltage level is properly set.

Known methods of ensuring the accuracy of a threshold voltage may involve inputting a DC calibration voltage to compare to the threshold voltage and adjusting the threshold voltage level accordingly. The calibration voltages, however, are typically pure DC values. This leaves open the possibility for distortions in the calibration signal, as well as error in the calibration process since pure DC voltages can only be applied at stepped levels. The "proper" level may very well be missed depending upon size of the step between levels.

Say, for example, a threshold voltage of 1 Volt is selected for a comparator in a time measurement device. Unbeknownst to the user, there is an offset of 0.005 Volts. Consequently, a setting of 1 Volt results in a $V_{TH}$ of 1.005 Volts. For a true threshold voltage of 1 Volt, the threshold should be set at 0.995 Volts.

To find the unknown offset, a DC calibration signal is input to the comparator with an initial value of 0.99 Volts. It is stepped in 0.01 Volt increments. At 0.99 and 1.00 Volts, nothing is detected. At 1.01 Volts, the signal is detected, because the (true) $V_{TH}$ of 1.005 has been exceeded. The true offset remains unknown because the step size was too large, and detection precision is subsequently lost when $V_{TH}$ is adjusted. Using a smaller step size may be impractical or impossible for the extremely small offsets encountered with precision components.

BRIEF SUMMARY OF THE INVENTION

In view of the recognized features encountered in the prior art and addressed by the present subject matter, an improved method for calibrating threshold voltage levels has been developed.

More particularly, dithered voltage generating circuitry to aid in calibration of a threshold voltage for use with a measurement device is disclosed. Such circuitry preferably comprises a first voltage source producing a DC output, a second voltage source producing a time-varying output, a waveform shaping circuit, and a summing circuit. The waveform-shaping circuit is electrically connected to the output of the second voltage source and modifies the time-varying output provided by such source. The summing circuit is configured to add the DC output produced by the first voltage source to the modified time-varying output produced by the second voltage source in conjunction with the waveform shaping circuit. The summing circuit outputs a calibration waveform comprising a nominal DC value featuring a plurality of peaks extending above the nominal DC value. In one particular exemplary embodiment, the waveform shaping circuit may comprise a diode, while the summing circuit may comprise a summing amplifier. The time-varying output of the second voltage source may feature smooth, rather than stepped, transitions between voltage levels. The second voltage source may comprise a function generator. The dithered voltage generating circuitry may be contained within a module connected to a comparator circuit of a measurement device such as a time interval analyzer.

In accordance with aspects of the invention, the measurement device is configured to detect, by monitoring the output of the comparator circuit, the peaks of the calibration waveform and adjust the threshold voltage until the threshold voltage is equal to the nominal DC value of the calibration waveform. Additional embodiments include a digital-to-analog converter under the control of the measurement device for producing and adjusting the threshold voltage input to the comparator circuit.

Additionally disclosed is a method for calibrating a threshold voltage input to a comparator circuit of a measurement device. Such a calibration method may comprise the steps of generating a calibration waveform comprising a nominal DC value featuring a plurality of peaks extending above the nominal DC value, providing the calibration waveform to a first input of the comparator circuit, providing a threshold voltage to a second input of the comparator circuit, and monitoring the output of the comparator circuit and changing the threshold voltage until the threshold voltage is equal to the nominal DC value of the calibration waveform. The nominal value of the calibration waveform may be the desired value for the threshold voltage provided to the comparator. In one embodiment, the threshold voltage is provided by a digital-to-analog converter in response to control commands issued from the measurement device. The calibration waveform may be generated by the summation of a DC voltage and a half-wave-rectified sinusoidal voltage, and the measurement device may comprise a time interval analyzer.

Further disclosed is a method for producing a calibration waveform to aid in the calibration of threshold voltage levels input to a comparator circuit, which includes the steps of generating a DC waveform and a time-varying voltage waveform, modifying the time-varying voltage waveform, and summing the modified and DC waveforms. Embodiments of the method include those in which the DC waveform is generated by a precision voltage source an the time-varying voltage waveform is rectified by a diode. Additional embodiments may employ a function generator to produce the time-varying voltage waveform and summing amplifier circuitry to produce the calibration waveform. In further additional embodiments, the resulting calibration waveform is output to a comparator circuit of a measurement device, which can include time interval analyzers.

In one embodiment of the disclosed method, the calibration waveform can be generated by a module that is selectively connected to comparator circuitry of a measurement device such as a time interval analyzer. A switch may connect the module to one or more comparator circuits, and the resulting determined offset voltages may be stored in an error table for use in future measurements.

Additional embodiments and aspects of the subject invention, not necessarily expressed in this summarized section, may include and incorporate various combinations of aspects of features, parts or steps referenced in the summarized description above, and/or other features, parts, steps, or elements as otherwise discussed. Those of ordinary skill in the art will better appreciate the features and aspects of such embodiments upon review of the specification hereinbelow. Thus, the scope of the presently disclosed technology should in no way be limited to any particular embodiment.

BRIEF DESCRIPTION OF THE DRAWINGS

A full and enabling disclosure of the present invention, including the best mode thereof, directed to one of ordinary skill in the art, is set forth in the FIG. 1(*a*) is a schematic representation of a typical comparator circuit as known to those skilled in the art;

FIG. 3 is a block diagram illustrating an exemplary calibration system in accordance with the present invention;

FIGS. 4(*a*) and 4(*b*) are exemplary signal event timing diagrams of signals generated by a dithered voltage generating circuit in accordance with the present invention, while FIGS. 4(*c*) and 4(*d*) illustrate the respective comparator outputs when the signals illustrated in 4(*a*) and 4(*b*) are applied as comparator inputs.

Figure 1B:
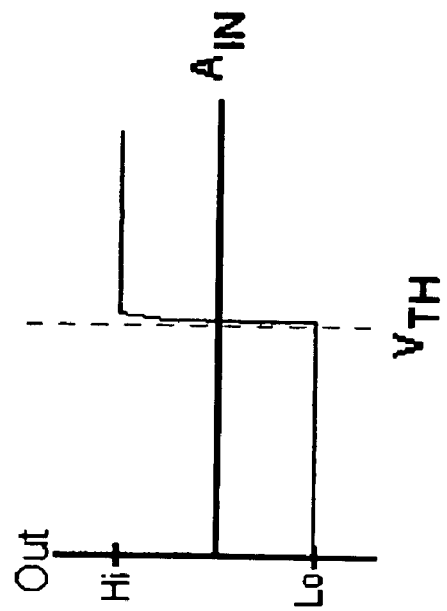
FIG. 1(*b*) provides a graphical representation of an exemplary output waveform from a comparator circuit such as that of FIG. 1(*a*)

Repeat use of reference characters throughout the present specification and appended drawings is intended to represent the same or analogous features or elements of the invention.

DETAILED DESCRIPTION

Reference will now be made in detail to presently preferred embodiments of the invention, examples of which are fully represented in the accompanying drawings. Such examples are provided by way of an explanation of the invention, not limitation thereof. In fact, it will be apparent to those skilled in the art that various modifications and variations can be made in the present invention, without departing from the spirit and scope thereof. For instance, features illustrated or described as part of one embodiment can be used on another embodiment to yield a still further embodiment. Still further variations in selection of materials and/or characteristics may be practiced, to satisfy particular desired user criteria. Thus, it is intended that the present invention covers such modifications and variations as come within the scope of the present features and their equivalents.

As previously set forth, time measurement devices can measure the occurrence of events in an input signal by utilizing a measurement circuit. The voltage level of the input signal is compared to a threshold level, and when that threshold is crossed, the measurement circuit produces a signal indicating that an event has occurred. The crossing of the threshold may be detected using a comparator circuit, which may comprise an operational amplifier circuit operating in an open-loop mode.

The two signals that are to be compared are provided to the amplifier inputs, and the amplifier then outputs a high or low signal based upon whether one input is of greater magnitude than the other; the particular correlation between high/low output signals and which input is used as the baseline for comparison depends upon the circuit configuration. For purposes of illustration, the remainder of this application will utilize the configuration illustrated in FIG. 1(*a*), in which the signal input is provided to the positive terminal, the threshold voltage ($V_{TH}$) 12 is provided to the negative terminal, and a positive output 16 from the amplifier 10 indicates that the signal input $A_{IN}$ 14 exceeds $V_{TH}$ 12. Associated with FIG. 1(*a*) is an input/output diagram indicating the transition from low to high on the output of the comparator when the input $A_{in}$ 14 exceeds $V_{TH}$ 12, depicted in FIG. 1(*b*). This particular comparator arrangement is depicted for exemplary purposes only; it should be understood that the embodiments of the present invention may be practiced with comparator circuitry of varying forms and input/output correlation.

Figure 2:
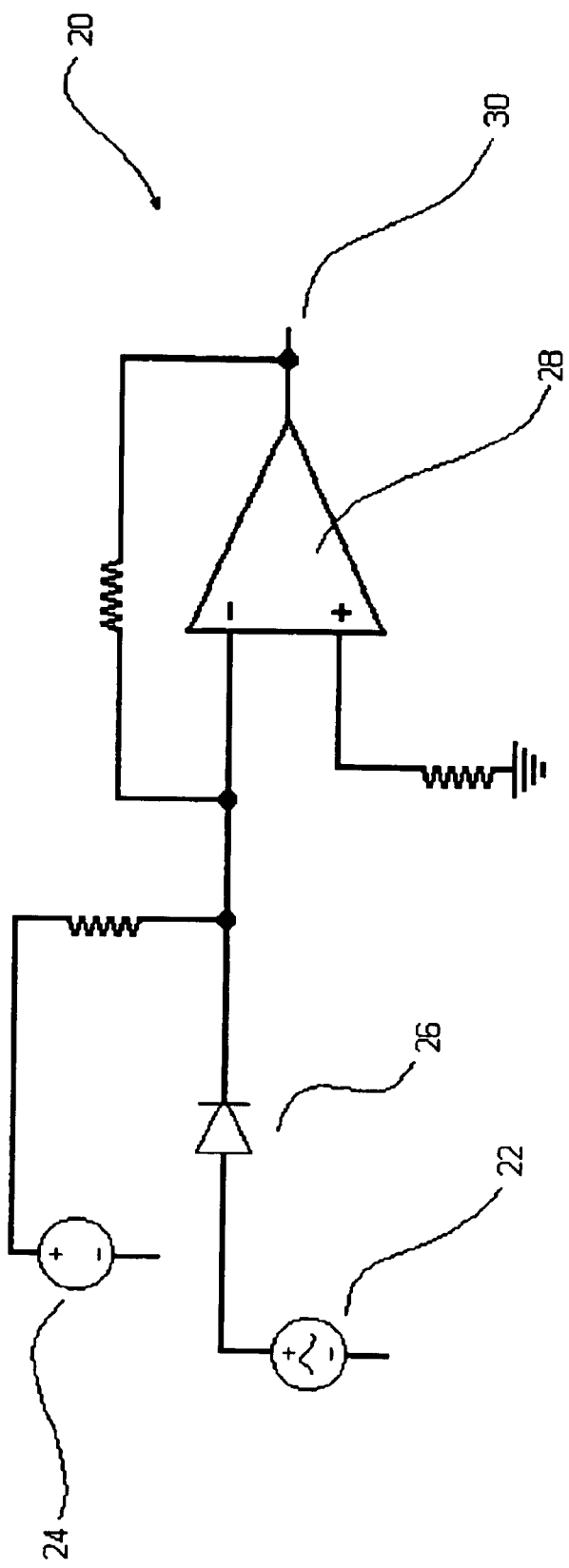
FIG. 2 is a schematic block diagram of an exemplary dithered voltage generating circuit in accordance with the present invention.

FIG. 2 illustrates a circuit diagram of one exemplary embodiment of the device of the present invention, voltage dithering circuitry 20. A high precision voltage source 22 and a varying voltage source 24 are provided as inputs to adding circuit 28, depicted for exemplary purposes as a summing amplifier. An adjustable time-varying voltage signal is produced by voltage source 22; source 22 may be any of a wide variety of signal sources known to those skilled in the art such as a signal or function generator. Source 24 provides a constant DC value, and may consist of a stable, high precision voltage reference. The time-varying signal produced by source 22 is passed through diode 26 and added to the DC voltage produced by 24 to produce a dithered output featured at point 30. This output is essentially a DC signal based upon the output level of source 24, but with added "peaks" and smooth, rather than stepped, transitions to the peaks from the baseline DC voltage. The role of the peaks provided by the addition of the diode-passed sinusoidal signal will be discussed hereinafter with respect to the disclosed calibration method.

Depending upon the type of diode and particular signal generated by source 22, a wide variety of peaks may be produced. The signal produced by source 22 may be sinusoidal in nature, or may consist of any signal featuring smooth transitions between varying voltage levels. The constant DC voltage produced by source 24 is preferably near the level initially selected as the threshold voltage for the comparator circuit $V_{TH}$. The remaining components of circuitry 20 and output of source 22 may be configured such that a pattern of repeating peaks is produced by circuitry 20 for output, wherein the peaks are added to the constant voltage source 24.

Voltage dithering circuitry 20 may be part of the system depicted in FIG. 3. FIG. 3 illustrates a time measurement device 40 connected by transmission element 42 to testing point 44. In this exemplary system, the measurement circuit is located within time measurement device 40, but those skilled in the art will recognize that the embodiments and aspects of the present invention may be applied to other systems which feature a measurement circuit. Time measurement device 40 may be a time interval analyzer, for example. Transmission element 42 can be a set of cables, while testing point 44 may contain additional automated equipment directed towards testing. Voltage dithering circuitry 20 may be contained within a calibration module 46, for connection to time measurement device through testing equipment 44 and cables 42. Alternatively, testing equipment 44 and cables 42 may be omitted and calibration module 46 connected directly to time measurement device 40. In an another alternative embodiment, the voltage dithering circuitry 20 may be incorporated directly into time measurement device 40.

Figure 1A:
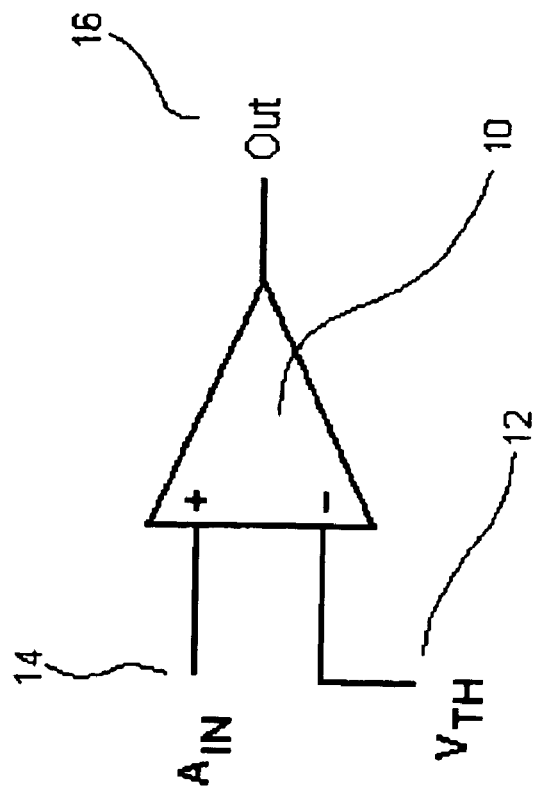

Voltage dithering circuitry 20 can be used to calibrate the reference voltage for a comparator circuit similar to that illustrated in FIG. 1. Typically, a time measurement device, such as device 40 illustrated in FIG. 3, features several comparators. In order to make precise measurements, precision components must be used. The amplifier and related traces, resistors, and other parts that are part of the time measurement device circuitry are carefully selected and matched. However, as stated earlier, unavoidable errors in detecting measurements due to voltage threshold offsets can become problematic.

Such a problem is illustrated in diagram 70 of FIG. 4(c). FIG. 4 consists of four timing diagrams: FIGS. 4(a) and 4(c) depict the precalibration comparator inputs and outputs, respectively, while FIGS. 4(b) and 4(d) depict postcalbration comparator inputs and outputs, respectively. The smooth dithered DC signal 62 provided by circuit 20 is input to time measurement device 40 and is routed to measurement circuitry containing a comparator. These comparators are configured to compare input voltage $A_{IN}$ to threshold voltage $V_{TH}$, and, as previously discussed, output a high signal when $A_{IN}$ is greater than $V_{TH}$.

Circuitry 20 has been precisely constructed to output the smooth dithered DC signal with a nominal base value indicated at 63 (in this case, one Volt). This nominal base value, chosen for exemplary purposes only, is the desired setting for $V_{TH}$ in the comparator circuitry of time measurement device 40. However, as indicated by 66 in diagram 60, $V_{TH}$ is actually above the nominal one volt value. This slight difference, as previously stated, can be due to imperfections in the internal voltage-generating circuitry. The external voltage sources 22 and 24 of circuitry 20 typically can produce a value much closer to one volt than the internal circuitry of time measurement device 40.

Smooth dithered DC signal 62 has a baseline value of precisely one Volt and features peaks 64. As illustrated, peaks 64 occur above comparator threshold voltage $V_{TH}$. Therefore, the portions of smooth dithered DC signal 62 which exceed $V_{TH}$ are registered as high outputs 72, 74, and 76 of timing diagram 70 in FIG. 4(c).

Time measurement device 40 is directed to adjust, in this case downward, the internal $V_{TH}$ value. This adjustment occurs until no more detection pulses are produced by the comparator circuitry, as indicated in timing diagram 90 of FIG. 4(d). Timing diagram 80 of FIG. 4(b) depicts the corresponding inputs. It can be seen that $V_{TH}$ has been lowered until it is truly equal to the nominal one Volt voltage of the dithered input signal, and thus, the desired value of $V_{TH}$. As such, none of the peaks register at the comparator.

Alternatively, the true voltage level of $V_{TH}$ may be offset such that it is lower than the desired $V_{TH}$. The level of $V_{TH}$ may be adjusted upward until peaks 64 of smooth dithered DC signal 62 are registered, and then adjusted downward as discussed above.

Figure 5:
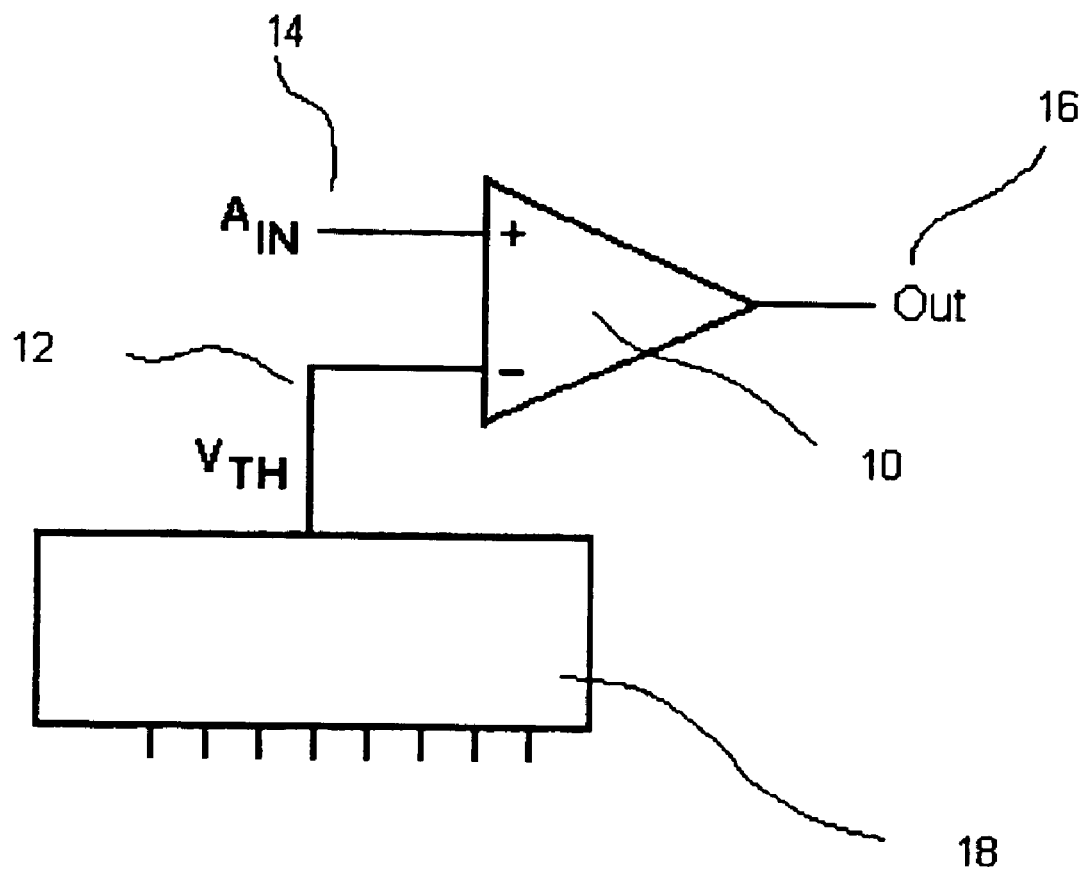
FIG. 5 is a circuit diagram of an exemplary comparator circuit used in accordance with aspects of the present subject matter.

In order to calibrate a comparator, a circuit such as that depicted in FIG. 5 may be used to slightly increase the baseline voltage $V_{TH}$. The circuit of FIG. 5 is similar to the basic comparator circuit of FIG. 1, but features the addition of digital-to-analog converter 18 to generate $V_{TH}$. As is known in the art, digital-to-analog converters produce an analog output voltage in response to a digital input. This allows time measurement device 40 to internally adjust the level of $V_{TH}$ during the calibration process.

The configuration of the comparator in FIG. 5 is typical of an input stage of a time measurement device. The digital-to-analog converter 18 and the comparator 10 may have small voltage offsets that may be calibrated using embodiments of the device disclosed herein. An internal computer can register the offset voltage found using the previously-described calibration procedure for each of a number of preset threshold levels (such as −0.5, −0.25, 0, 0.25, 0.5, 0.75, 1.00, 1.25 Volts—such voltages are presented for exemplary purposes only). An offset table can be created as a result of this process and used later on to correct the setting of the digital-to-analog converter 18 to output the precisely desired level.

Typically, the calibration process may be controlled by a computer program operating upon time measurement device 40. The nominal voltage level produced by source 24 and the sinusoidal signal produced by source 22 may be controlled by the same, or may be set at circuit 20 by selection switches.

Although a preferred embodiment of the invention has been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged both in whole or in part. Therefore, the spirit and scope of the appended claims should not be limited to the description of the preferred version contained herein.

What is claimed is:

1. Dithered voltage generating circuitry to aid in calibration of a threshold voltage for use with a measurement device, comprising:

a first voltage source producing a DC output;

a second voltage source producing a time-varying output;

a waveform shaping circuit, electrically connected to the output of said second voltage source, and modifying the time-varying output provided by such source, wherein said waveform shaping circuit comprises a diode; and a summing circuit configured to add the DC output produced by said first voltage source to the modified time-varying output produced by said second voltage source in conjunction with said waveform shaping circuit, and wherein said summing circuit outputs a calibration waveform comprising a nominal DC value featuring a plurality of peaks extending above the nominal DC value.

2. The dithered voltage generating circuitry of claim 1, wherein said summing circuit comprises a summing amplifier, and wherein the time-varying output produced by said second voltage source features smooth transitions between voltage levels.

3. The dithered voltage generating circuitry of claim 1, wherein said summing circuit comprises a summing amplifier; and wherein said second voltage source comprises a function generator.

4. Dithered voltage generating circuitry to aid in calibration of a threshold voltage for use with a measurement device, comprising:

a first voltage source producing a DC output;

a second voltage source producing a time-varying output;

a waveform shaping circuit, electrically connected to the output of said second voltage source, and modifying the time-varying output provided by such source; and a summing circuit configured to add the DC output produced by said first voltage source to the modified time-varying output produced by said second voltage source in conjunction with said waveform shaping circuit, and wherein said summing circuit outputs a calibration waveform comprising a nominal DC value featuring a plurality of peaks extending above the nominal DC value; and wherein said circuitry is contained within a module selectively connected through a switch to at least one comparator circuit associated with the measurement device.

5. The dithered voltage generating circuitry of claim 4, wherein the measurement device includes voltage threshold generating circuitry for producing a threshold voltage for input to the at least one comparator circuit associated with the measurement device, and wherein the voltage threshold generating circuitry comprises digital-to-analog converter circuitry that is responsive to control commands provided by the measurement device for adjusting the threshold voltage level input to the comparator circuit.

6. The dithered voltage generating circuitry of claim 5, wherein said measurement device is configured to detect, by monitoring the output of the comparator circuit, the peaks of said calibration waveform comprising a nominal DC value featuring a plurality of peaks extending above the nominal DC value, and wherein said measurement device is configured to adjust the threshold voltage until the threshold voltage is equal to the nominal DC value of the calibration waveform.

7. The dithered voltage generating circuitry of claim 6, wherein the measurement device comprises a time interval analyzer.

8. A method for calibrating a threshold voltage input to a comparator circuit of a measurement device comprising the steps of:

generating a calibration waveform, wherein said calibration waveform comprises a nominal DC value featuring a plurality of peaks extending above the nominal DC value;

providing said calibration waveform to a first input of the comparator circuit;

providing a threshold voltage to a second input of the comparator circuit; and monitoring the output of the comparator circuit and changing the threshold voltage until the threshold voltage is equal to the nominal DC value of the calibration waveform.

9. The method of claim 8, wherein the nominal value of said calibration waveform is the desired value for the threshold voltage provided to said comparator.

10. The method of claim 9, wherein the threshold voltage is provided by a digital-to-analog converter in response to control commands issued from said measurement device.

11. The method of claim 10, wherein said substantially DC waveform is generated by the summation of a DC voltage and a half-wave-rectified sinusoidal voltage.

12. The method of claim 11, wherein the measurement device comprises a time interval analyzer.

13. A method for producing a calibration waveform to aid in the calibration of threshold voltage levels input to a comparator circuit comprising the steps of:

(a) generating a DC waveform;

(b) generating a time-varying voltage waveform;

(c) modifying the time-varying voltage waveform; and (d) adding the modified time-varying waveform to said DC waveform to create a calibration waveform, wherein said calibration waveform transitions between a baseline value and a plurality of peak values with substantially smooth and non-instantaneous transitions between the baseline value and each peak value.

14. The method of claim 13 wherein generating step (a) is performed by a precision voltage source, and wherein modifying step (c) comprises rectifying the time-varying voltage waveform.

15. The method of claim 14 wherein generating step (b) is performed by a function generator and adding step (d) is performed by summing amplifier circuitry.

16. The method of claim 15 further comprising the step of outputting the calibration waveform produced by adding step (d) to the input of at least one comparator of a measurement circuit.

17. The method of claim 16 wherein said measurement circuit is operably associated with a time interval analyzer.

18. A calibration procedure for determining voltage offsets in comparator circuitry associated with a measurement device, the procedure comprising the steps of:
   providing a threshold voltage to a first input of a comparator circuit associated with a measurement device;
   generating a DC waveform and a time-varying waveform;
   summing the DC and time-varying waveforms to produce a calibration waveform, the calibration waveform comprising a nominal DC voltage featuring a plurality of peaks extending above the value of the DC voltage, wherein the nominal DC voltage corresponds to the desired value of the threshold voltage;
   providing the calibration waveform to a second input of the comparator circuit;
   monitoring the output of the comparator circuit and adjusting the value of the threshold voltage provided to the first input of the comparator circuit until the threshold voltage is equal to the voltage of the DC waveform and no comparator output is detected;
   determining, from the final adjusted value of the threshold voltage and the DC voltage, the offset voltage associated with the particular threshold voltage initially provided to the comparator circuit; and
   storing the offset in an error table for use in correcting the threshold voltage level setting for future measurements utilizing the comparator circuit.

19. The calibration procedure of claim 18, wherein said steps of generating and summing are performed in a hardware module selectively connected to at least one comparator circuit of the measurement device through a switch.

20. The calibration procedure of claim 19, further comprising the step of repeating the calibration procedure for a plurality of threshold voltages.

21. The calibration procedure of claim 20, wherein the measurement device comprises a time interval analyzer.

* * * * *

UNITED STATES PATENT AND TRADEMARK OFFICE
CERTIFICATE OF CORRECTION

PATENT NO.   : 6,822,485 B2
DATED        : November 23, 2004
INVENTOR(S)  : Shalom Kattan It is certified that error appears in the above-identified patent and that said Letters Patent is hereby corrected as shown below:

Column 8,
Line 52, omit the word "waveform".

Signed and Sealed this

Fifth Day of July, 2005

JON W. DUDAS
*Director of the United States Patent and Trademark Office*